US 6,670,232 B2

(12) United States Patent
Tsunemine

(10) Patent No.: US 6,670,232 B2
(45) Date of Patent: Dec. 30, 2003

(54) PROVIDING A CONDUCTIVE MATERIAL IN AN OPENING

(75) Inventor: Yoshikazu Tsunemine, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/216,358

(22) Filed: Aug. 12, 2002

(65) Prior Publication Data

US 2003/0139008 A1 Jul. 24, 2003

(30) Foreign Application Priority Data

Jan. 22, 2002 (JP) ........................................ 2002-012408

(51) Int. Cl.[7] .......................................... H01L 21/8242
(52) U.S. Cl. ........................ 438/243; 438/244; 438/240
(58) Field of Search ................... 430/243, 244, 430/240

(56) References Cited

U.S. PATENT DOCUMENTS 6,358,837 B1 * 3/2002 Miller et al. ................. 438/622
6,384,443 B1   5/2002 Tsunemine
2003/0008417 A1 * 1/2003 Suzuki .......................... 438/3

FOREIGN PATENT DOCUMENTS

| JP | 8-97219 | 4/1996 |
| JP | 11-186270 | 7/1999 |
| JP | 2000-252441 | 9/2000 |

* cited by examiner

*Primary Examiner*—Micael S. Lebentritt
*Assistant Examiner*—Brad Smith
(74) *Attorney, Agent, or Firm*—Oblon, Spivak, McClelland, Maier & Neustadt, P.C.

(57) ABSTRACT

A conductive layer (5) including polycrystalline silicon is provided on a second interlayer insulating film (3). An opening (OP1) is defined in the conductive layer (5). Thereafter utilizing electroplating, a conductive material (4a) serving as a capacitor lower electrode is formed in the opening (OP1). The conductive layer (5) holds an insulating layer (6) provided thereon, thus avoiding the conductive material (4a) from being deposited over the conductive layer (5). Therefore, the conductive material can be formed with reliability in the opening. Further, it is possible to omit the steps of forming a redundant film and removing the same.

11 Claims, 13 Drawing Sheets

F I G . 1 2
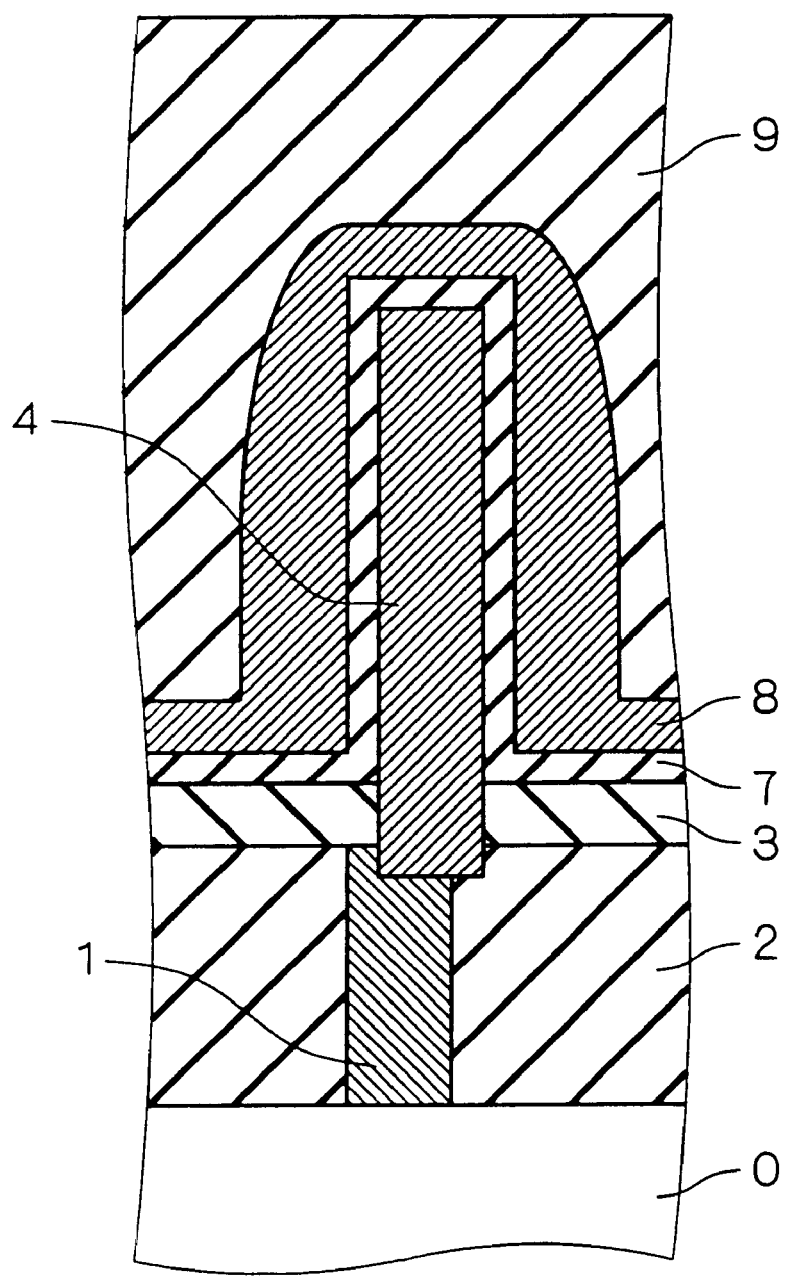
PRIOR ART

PRIOR ART

PRIOR ART

PROVIDING A CONDUCTIVE MATERIAL IN AN OPENING

BACKGROUND OF THE INVENTION

1. Field of the Invention

The present invention relates to a method of manufacturing a semiconductor device having a capacitor.

2. Description of the Background Art

A DRAM (dynamic random access memory) is one of semiconductor memory devices for allowing random input/output of stored data. A DRAM generally has a memory cell array section serving as a region for accumulating a large amount of stored data, and a peripheral circuit section responsible for I/O operations to and from outside.

The memory cell array section includes a number of memory cells arranged in a matrix and covers a large area on a semiconductor chip. Each memory cell is capable of accumulating unit memory data. The memory cell generally includes one MOS (metal oxide semiconductor) transistor and one capacitor connected to the MOS transistor. The memory cell of this type is called as a one-transistor one-capacitor cell. The one-transistor one-capacitor memory cell has a simple configuration and hence, can be suitably adopted for increasing density in the memory cell array. In view of this, the one-transistor one-capacitor memory cell is widely used in mass DRAMs.

FIG. 12 illustrates an exemplary structure of a capacitor constituting the one-transistor on-capacitor memory cell. As illustrated in FIG. 12, a first interlayer insulating film 2 including silicon oxide is provided on a semiconductor substrate 0 that may be a silicon substrate, for example. The first interlayer insulating film 2 includes a plug 1 formed therein. The plug 1 includes titanium nitride and penetrates the first interlayer insulating film 2. Further, a second interlayer insulating film 3 including silicon oxide is stacked to cover the plug 1 and the first interlayer insulating film 2.

A lower electrode 4 including platinum is connected to the plug 1. The lower electrode 4 penetrating the second interlayer insulating film 3 stands upright on the plug 1, slightly cutting into the plug 1.

A dielectric film 7 including a high dielectric constant material such as barium strontium titanate is provided to cover the lower electrode 4 and the second interlayer insulating film 3. Further, an upper electrode 8 including platinum is provided for covering the dielectric film 7. The elements described so far constitute a capacitor.

Further, a third interlayer insulating film 9 is provided to cover the upper electrode 8. The third interlayer insulating film 9 provided over the capacitor includes aluminum interconnection formed therein (not illustrated). Still further, the semiconductor substrate 0 includes an element isolating oxide film, an active region, a MOS transistor connected to the plug 1, and the like each formed therein (none of which are illustrated).

For the purpose of increasing density in the memory cell array, an effort has been underway to shrink the dimension of a capacitor for constituting each memory cell. As seen from FIG. 12, a capacitor has been of an elongated structure, for example, thus allowing shrinkage of the capacitor in dimension without reducing capacitance thereof. According to this structure, even when areas of upper and bottom surfaces of the lower electrode 4 are respectively reduced for the purpose of shrinkage, a lateral area of the same can still be enlarged. Hence, there occurs no reduction in contact area between the lower electrode 4 and the dielectric film 7.

However, it has been difficult to form the lower electrode 4 into an elongated structure. That is, due to small pattern width, inclination of a pattern may be caused in a photoresist by merely performing ordinary photolithography and etching. Alternatively, even if there occurs no pattern inclination, a resultant width of the lower electrode 4 does not comply with that of a pattern. In this case, the lower electrode 4 may extend widely in width.

As a countermeasure against this problem, a damascene process has been suggested for forming the lower electrode 4. FIGS. 13 and 14 illustrate in part the steps of the damascene process.

First, the plug 1, and the first and second interlayer insulating films 2 and 3 are provided on the semiconductor substrate 0. Further provided on the upper surface of the second interlayer insulating film 3 is a mold 10 including a silicon oxide film, for example. Utilizing lithography and etching, an opening OP2 for forming the lower electrode 4 is defined in the mold 10 (FIG. 13). As illustrated in FIG. 14, platinum is thereafter deposited by sputtering, for example. Then a film 4c defined over the upper surface of the mold 10 is removed by the technique such as CMP (chemical mechanical polishing). Next, the mold 10 is removed. Following this, the dielectric film 7, the upper electrode 8, and the third interlayer insulating film 9 are provided, thus completing the capacitor as illustrated in FIG. 12.

Following the damascene process as described, reduction in pattern width of a photoresist will not occur, thus preventing the foregoing problem. Hence, the lower electrode 4 can be formed into an elongated shape.

However, the damascene process still has a problem. That is, the redundant film 4c is inevitably defined over the mold 10, necessitating the step of removing the same. Further, when a material for forming an electrode is deposited by sputtering, for example, it is quite difficult to deposite the same only in the opening OP2. In contrast, the reduced amount of material may cause the problem that the opening OP2 cannot be filled to a sufficient degree. As a result, the lower electrode 4 cannot be properly formed.

SUMMARY OF THE INVENTION

It is an object of the present invention to provide a method of manufacturing a semiconductor device capable of omitting the steps of forming a redundant film and removing the same.

According to a first aspect of the present invention, the method of manufacturing a semiconductor device includes the following steps (a) through (e). The step (a) provides an element. The step (b) provides a conductive layer. The step (c) provides an insulating layer. The step (d) defines an opening. The step (e) brings the conductive layer to a conducting state for providing a conductive material in the opening. In the step (a), the element is arranged in a main surface of a semiconductor substrate. In the step (b), the conductive layer is arranged above the main surface of the semiconductor substrate through an interlayer insulating film. In the step (c), the insulating layer is arranged on the conductive layer. The opening penetrates the insulating layer and the conductive layer. The conductive material is electrically connected to the element.

The conductive layer is brought to a conducting state and the conductive material is provided in the opening. Therefore, the conductive material is formed with reliability in the opening. Further, the conductive layer holds the insulating layer provided thereon. Therefore, it is possible to avoid the conductive material from being deposited over the conductive layer. As a result, the method is allowed to omit the steps of forming a redundant film and removing the same.

According to a second aspect of the present invention, the method of manufacturing a semiconductor device includes the following steps (a) through (e). The step (a) provides an element. The step (b) provides a first layer. The step (c) provides a second layer. The step (d) defines an opening. The step (e) selectively provides a conductive material in the opening by CVD. In the step (a), the element is arranged in a main surface of a semiconductor substrate. In the step (b), the first layer is arranged above the main surface of the semiconductor substrate through an interlayer insulating film. In the step (c), the second layer is arranged on a surface of the first layer. The opening penetrates both the first and second layers. The conductive material is electrically connected to the element. The conductive material is selectively deposited more on the first layer than the second layer with respect to CVD.

The conductive material selectively deposited more on the first layer than the second layer with respect to CVD is formed in the opening by CVD. Therefore, the conductive material can be formed with reliability in the opening. Further, the second layer on which the conductive material is characteristically deposited less than the first layer with respect to CVD is provided on the first layer. Therefore, it is allowed to avoid the conductive material from being deposited over the first layer. As a result, the method is allowed to omit the steps of forming a redundant film and removing the same.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 illustrates an exemplary structure of a capacitor constituting a one-transistor one-capacitor memory cell.

DESCRIPTION OF THE PREFERRED EMBODIMENTS

<First Preferred Embodiment>

In the method of manufacturing a semiconductor device according to the first preferred embodiment of the present invention, a conductive layer is provided and an opening is defined in the conductive layer. Utilizing plating, a conductive material to serve as a capacitor lower electrode can be formed with reliability in the opening. Further, the steps of forming a redundant film and removing the same can be omitted.

The method according to the first preferred embodiment will be described also taking the capacitor illustrated in FIG. 12 as an example.

First, an element isolating oxide film, an active region and a transistor, and the like (none of which are illustrated) are provided in the semiconductor substrate 0 that may be a silicon substrate. Next, following a process such as CVD (chemical vapor deposition), the first interlayer insulating film 2 including silicon oxide is provided on the semiconductor substrate 0. Further, a contact hole contacting the active region and the element provided in the surface of the semiconductor substrate 0 is defined.

Thereafter the contact hole is filled with titanium nitride, thus forming the plug 1 penetrating the first interlayer insulating film 2. More particularly, as an example, titanium tetrachloride and ammonia gas are used for depositing titanium nitride by thermal CVD. The film thereby formed is then subjected to CMP and etchback, thus forming the plug 1 including titanium nitride.

Figure 1:
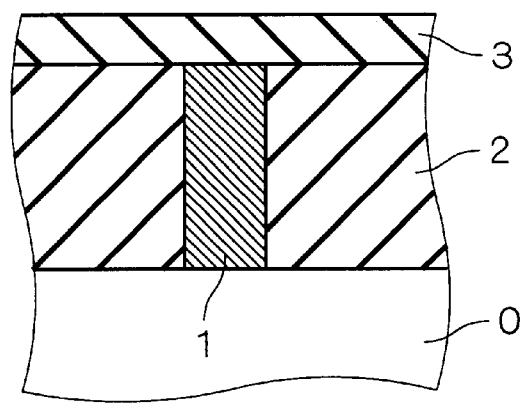
FIGS. 1 through 6 illustrate a method of manufacturing a semiconductor device according to a first preferred embodiment of the present invention.

Thereafter the second interlayer insulating film 3 including silicon oxide is provided to cover the first interlayer insulating film 2 and the plug 1 (FIG. 1). The second interlayer insulating film 3 is formed by using TEOS (tetraethoxysilane) gas and oxygen gas by thermal CVD. The second interlayer insulating film 3 may be formed at a temperature of 680° C., for example, growing to a thickness such as 100 nm.

Figure 2:
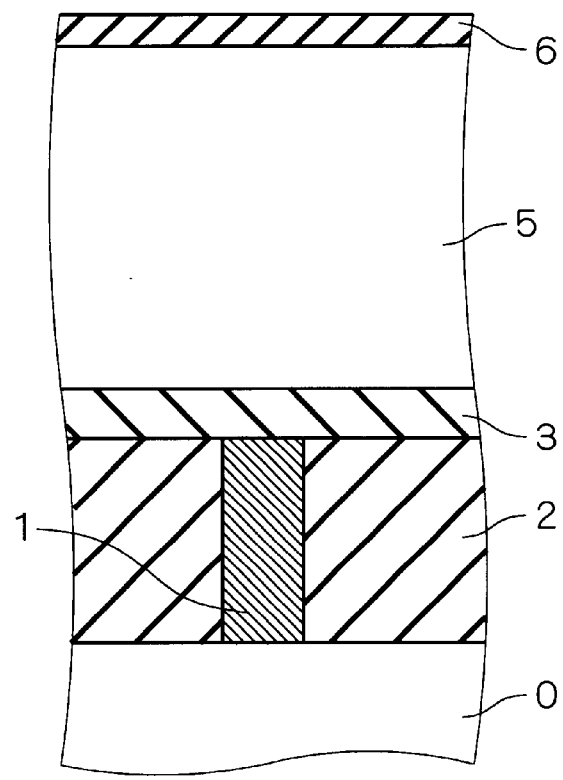

Next, a conductive layer 5 including polycrystalline silicon is provided on the second interlayer insulating film 3. Further, an insulating layer 6 including silicon oxide is provided on the conductive layer 5 (FIG. 2). The conductive layer 5 and the insulating layer 6 are each formed by thermal CVD, growing to respective thicknesses of 500 nm and 100 nm, for example. More particularly, the conductive layer 5 is formed by using silane gas and phosphine gas at a temperature of 520° C., for example. The insulating layer 6 is formed by using TEOS gas and oxygen gas at a temperature of 680° C., for example.

Figure 3:
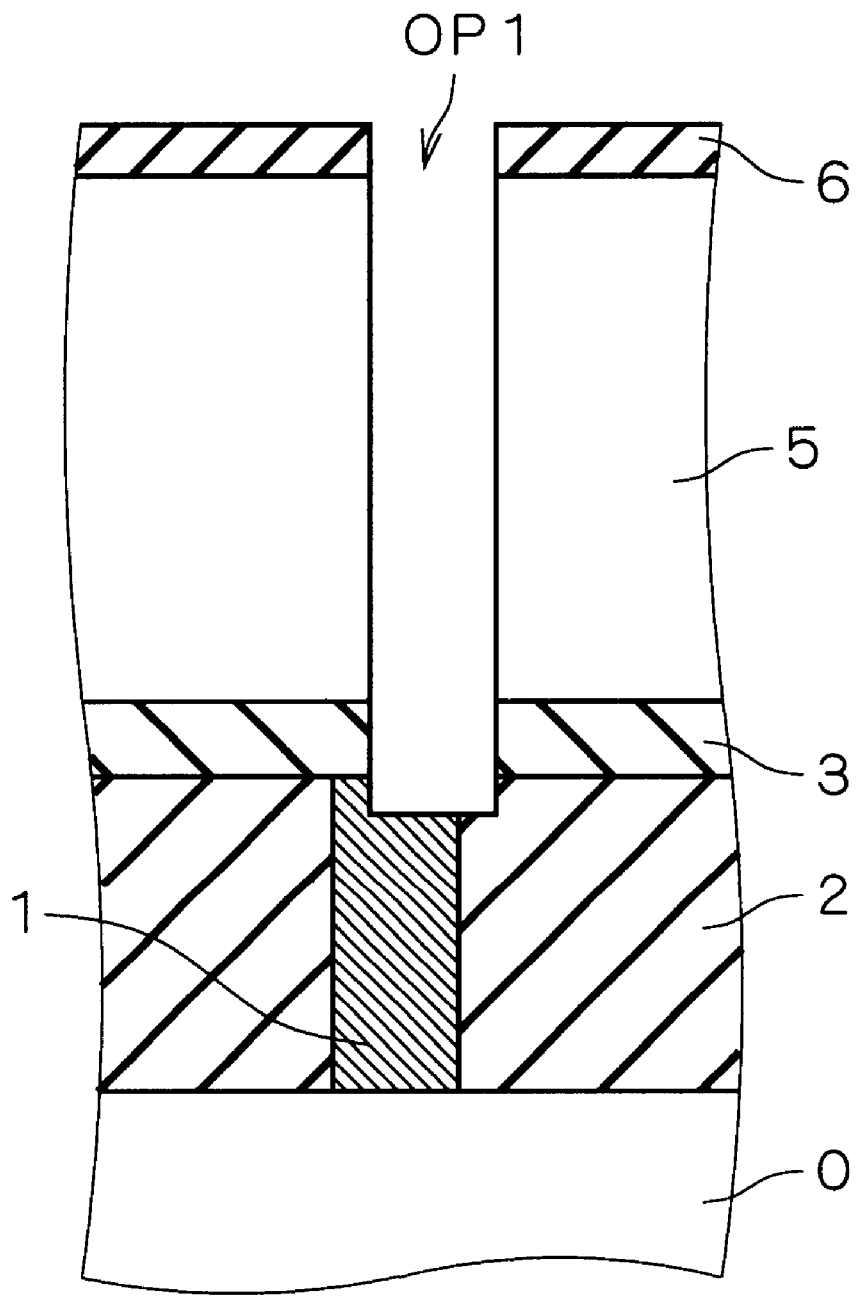

Subsequent to this, utilizing lithography and etching, an opening OP1 is defined for penetrating the conductive layer 5, the insulating layer 6, and the second interlayer insulating film 3 while exposing the plug 1 (FIG. 3). The opening width of the opening OP1 is set to be 200 nm, for example. The insulating layer 6 and the second interlayer insulating film 3 are etched by RIE (reactive ion etching) using carbon tetrafluoride and oxygen gases. The conductive layer 5 is etched by RIE using chlorine gas. Etching of the conductive layer 5 and the second interlayer insulating film 3 is performed by using a photoresist that is also used in the etching process for the insulating layer 6. That is, once a photoresist is formed, the second interlayer insulating film 3, the conductive layer 5, and the insulating layer 6 can be sequentially etched.

Figure 4:
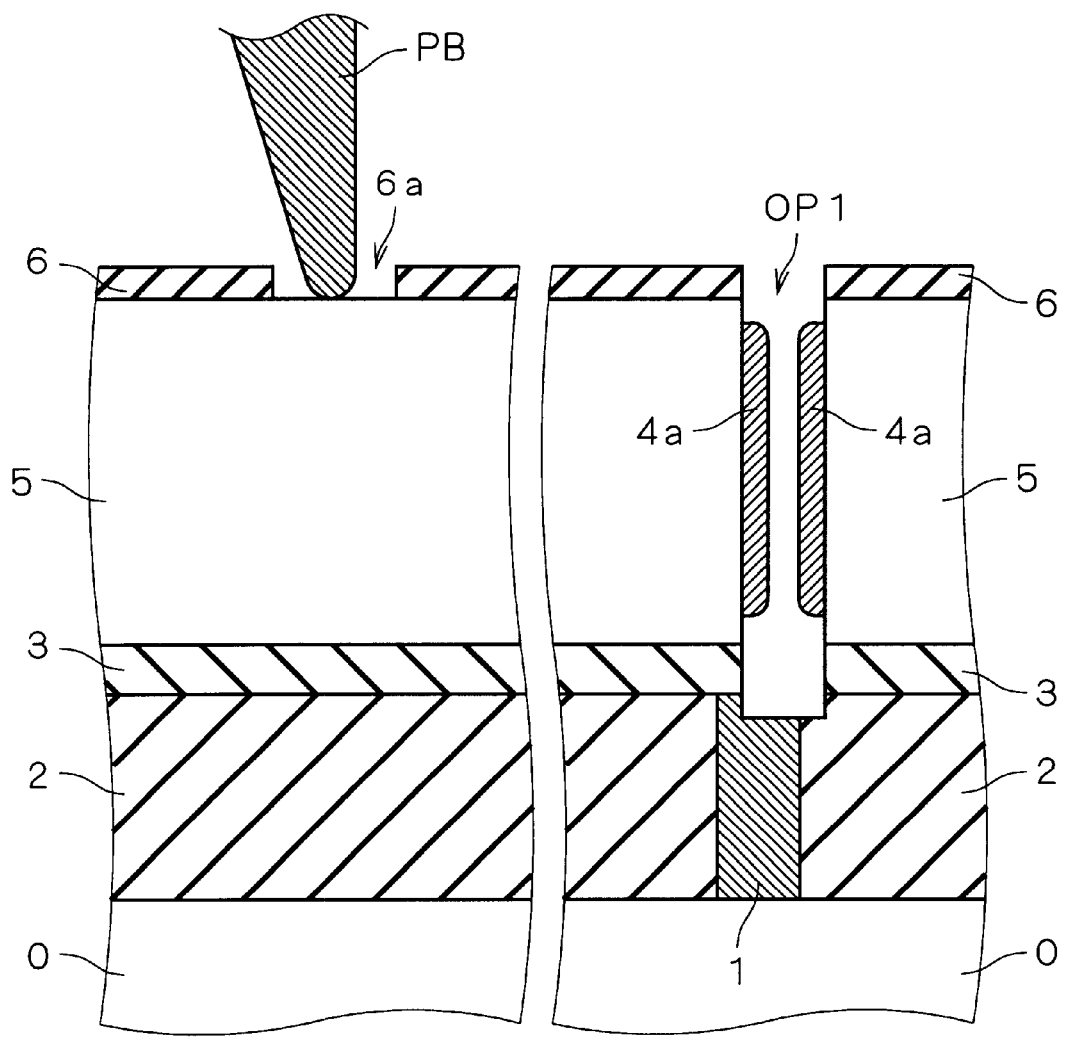

Next, the conductive layer 5 is brought to a conducting state and a side surface of the conductive layer 5 exposed to the opening OP1 undergoes electroplating, thus forming a conductive material 4a including platinum from the side surface thereof (FIG. 4). The transition of the conductive layer 5 to a conducting state is achieved as follows as illustrated in FIG. 4. That is, a region 6a including no insulating layer is partially defined on the surface of the conductive layer 5. A probe PB for conduction is provided to be in touch with the conductive layer 5 through the region 6a, thus bringing the conductive layer 5 to a conducting state.

Figure 5:
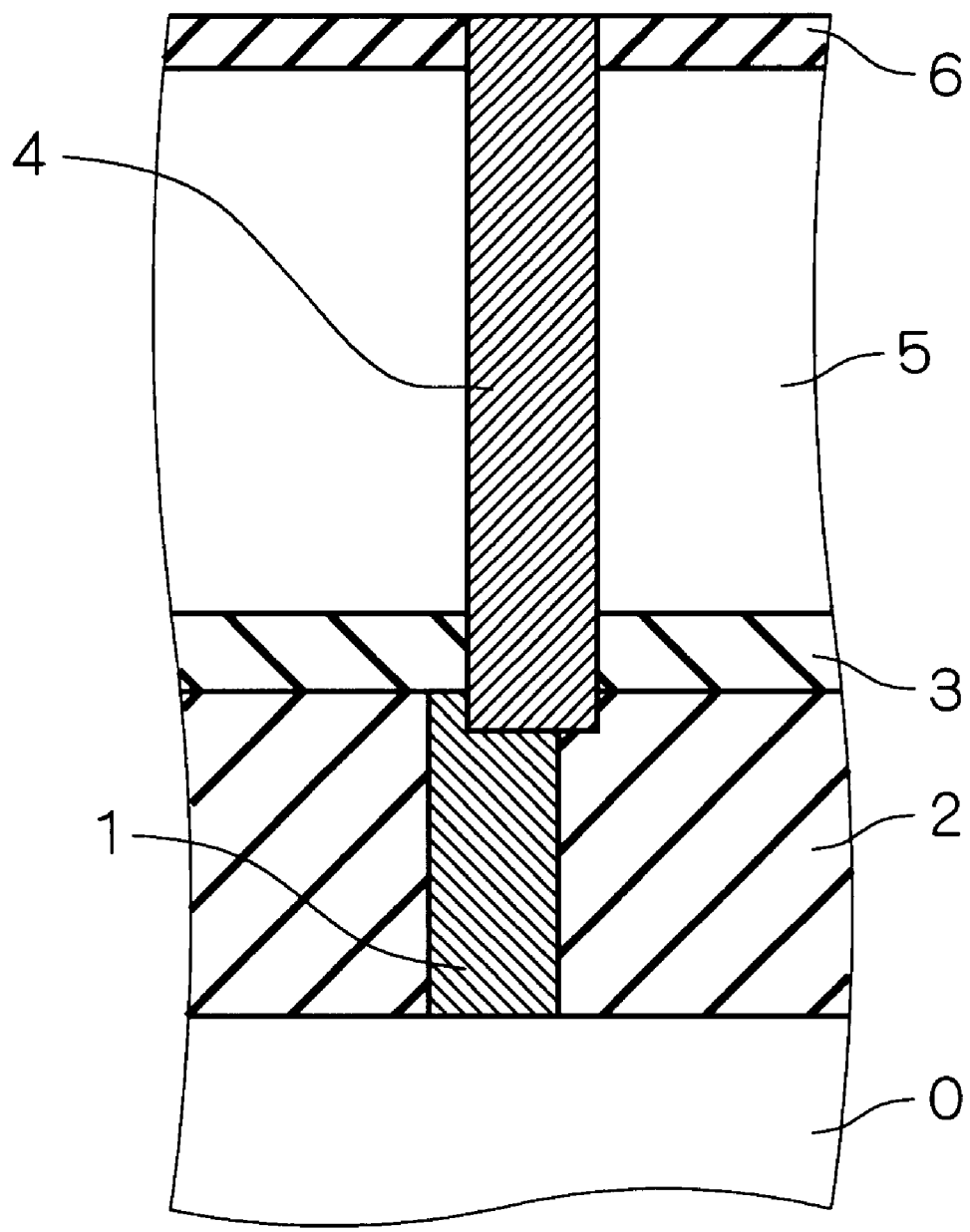

After the opening OP1 is filled with the conductive material 4a and the lower electrode 4 is formed (FIG. 5), the conducting state of the conductive layer 5 is ended. For process conditions of plating, a current density of 1 A/dm² and a three-minute conducting period may be required.

Figure 6:
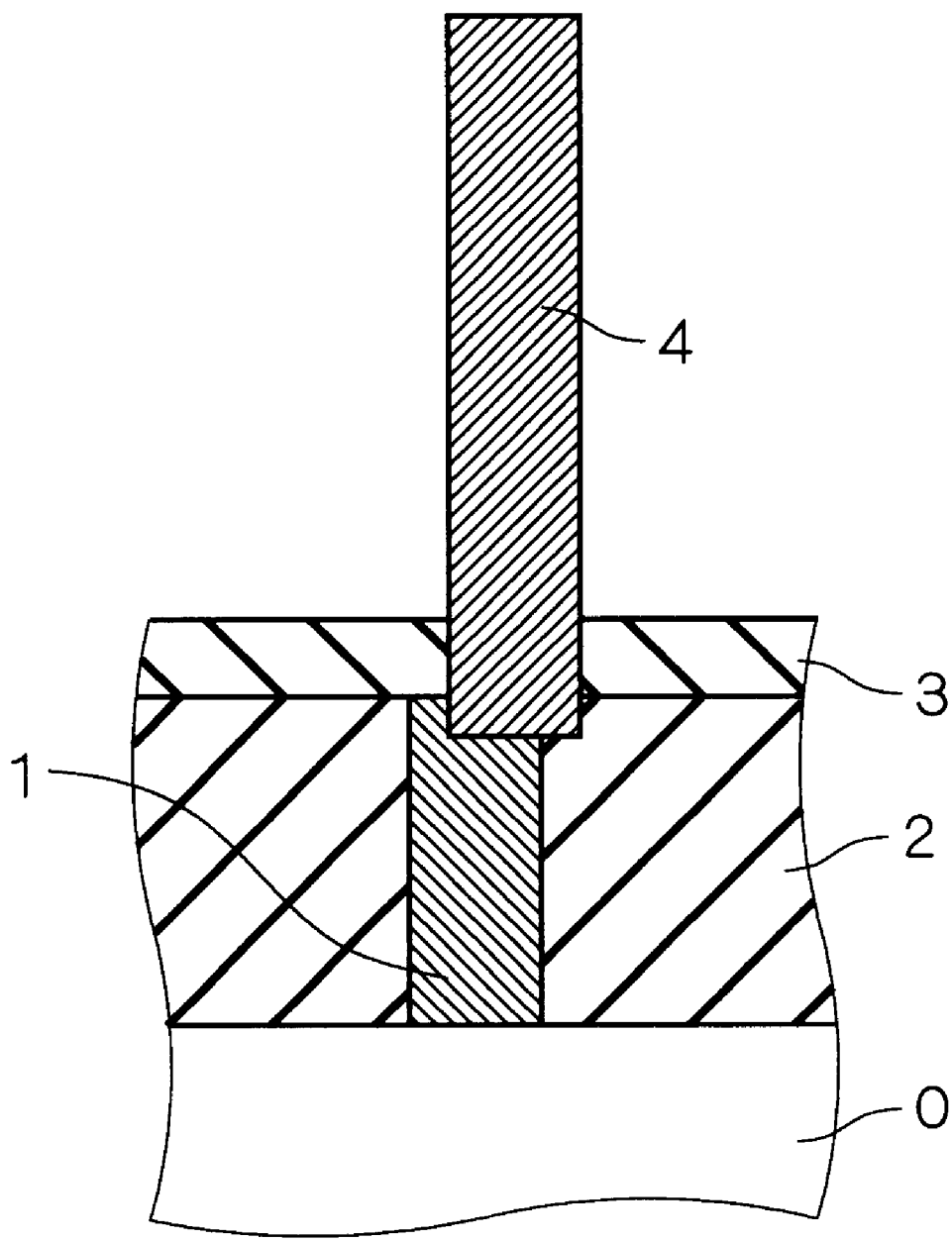

Next, the insulating layer 6 and the conductive layer 5 are removed by dry etching, for example (FIG. 6). More particularly, the insulating layer 6 is etched by RIE using carbon tetrafluoride gas and oxygen gases. The conductive layer 5 is etched by RIE using chorine gas.

Thereafter the dielectric film 7 and the upper electrode 8 are provided for forming the capacitor, and the third interlayer insulating film 9 is also provided thereon, thus completing the structure illustrated in FIG. 12.

According to the method of the first preferred embodiment, the conductive layer 5 is brought to a conducting state and the opening OP1 is filled with a conductive material utilizing electroplating. As a result, the conductive material 4a can be formed with reliability in the opening OP1. Further, the insulating layer 6 is provided over the conductive layer 5. Therefore, it is possible to avoid the conductive material 4a from being deposited over the conductive layer 5. As a result, according to the method of the first preferred embodiment, the steps of forming a redundant film and removing the same can be omitted.

Further, the conductive layer 5 includes polycrystalline silicon and the insulating layer 6 is a silicon oxide film. These are therefore easily formed by the process such as CVD, and are easily removed by dry etching, for example.

Still further, the conductive material 4a serves as an electrode of a capacitor. The opening OP1 defined to have an elongated structure thus results in an elongated shape of the capacitor. Therefore, shrinkage of the capacitor is allowed without reducing capacitance thereof.

Japanese Patent Application Laid-Open No. 11-186270 (1999) introduces the technique of forming interconnection by electroplating. According to the disclosure thereof, a photoresist provided on a substrate as a first mask is patterned. An electrode for plating is then provided on the first mask. Also provided on the electrode is a photoresist as a second mask. The second mask is also patterned. Next, using the electrode for plating exposed to an opening, a conductive material is deposited.

However, the technique of forming a capacitor lower electrode by plating disclosed therein has a problem. That is, misalignment may occur with high probability between patterns formed on the first and second masks. Due to this, the technique introduced in Japanese Patent Application Laid-Open No. 11-186270 (1999) cannot be suitably adopted for forming a capacitor lower electrode of a fine structure.

In contrast, according to the present invention, the conductive layer 5 and the insulating layer 6 are sequentially etched using a single photoresist, thus defining the opening OP1. Therefore, misalignment between patterns of the conductive layer 5 and the insulating layer 6 may occur with low probability. As a result, a capacitor lower electrode can be formed with high precision.

<Second Preferred Embodiment>

The second preferred embodiment of the present invention is a modification of the method of manufacturing a semiconductor device according to the first preferred embodiment. According to the second preferred embodiment, the conductive layer 5 including polycrystalline silicon is thermally oxidized, thus forming an insulating layer including silicon oxide.

Figure 7:
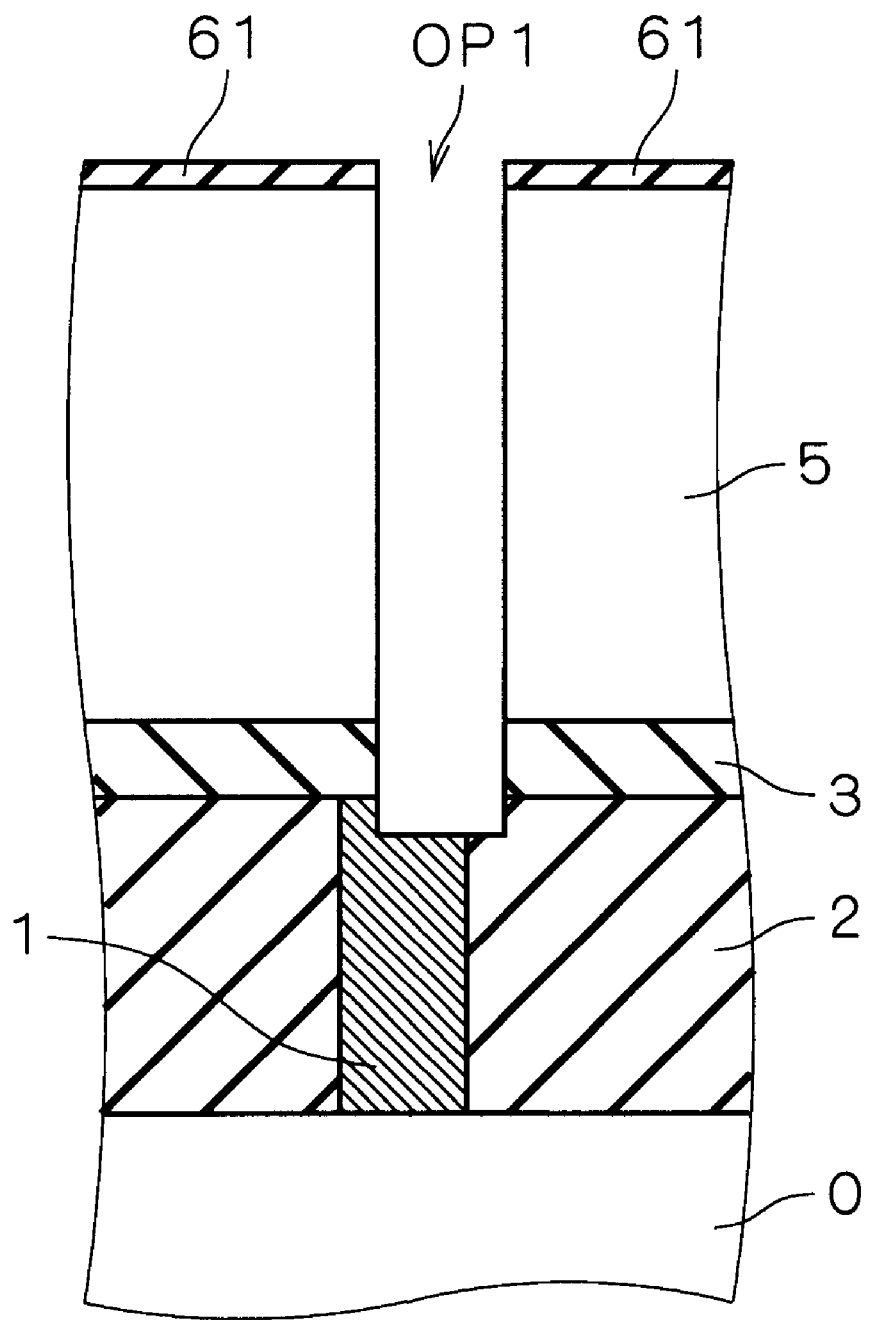
FIG. 7 illustrates a method of manufacturing a semiconductor device according to a second preferred embodiment of the present invention.

FIG. 7 illustrates the thermal oxidation step in the method according to the second preferred embodiment. In the first preferred embodiment, the insulating layer 6 is provided on the conductive layer 5 by thermal CVD. In contrast, in the second preferred embodiment, the upper surface of the conductive layer 5 is thermally oxidized, thus forming a silicon oxide film as an insulating layer 61.

The insulating layer 61 is formed using mixed gas including hydrogen and oxygen. For process conditions of oxidation for growing the insulating layer 61 to a thickness of 20 nm, a temperature of 800° C. and a 30-minute period are required, for example. Further, the thickness of the conductive layer 5 is 500 nm.

Except for that described above, the second preferred embodiment follows the same steps as those in the method according to the first preferred embodiment. Hence, the description thereof is omitted.

According to the method of the second preferred embodiment, the insulating layer 61 is formed by thermal oxidation of the conductive layer 5. As a result, the insulating layer 61 can be formed more easily.

<Third Preferred Embodiment>

The third preferred embodiment of the present invention is another modification of the method of manufacturing a semiconductor device according to the first preferred embodiment. According to the third preferred embodiment, after the opening OP1 is defined in the conductive layer 5, an insulating layer is formed by the process having poor step coverage such as plasma CVD.

Figure 8:
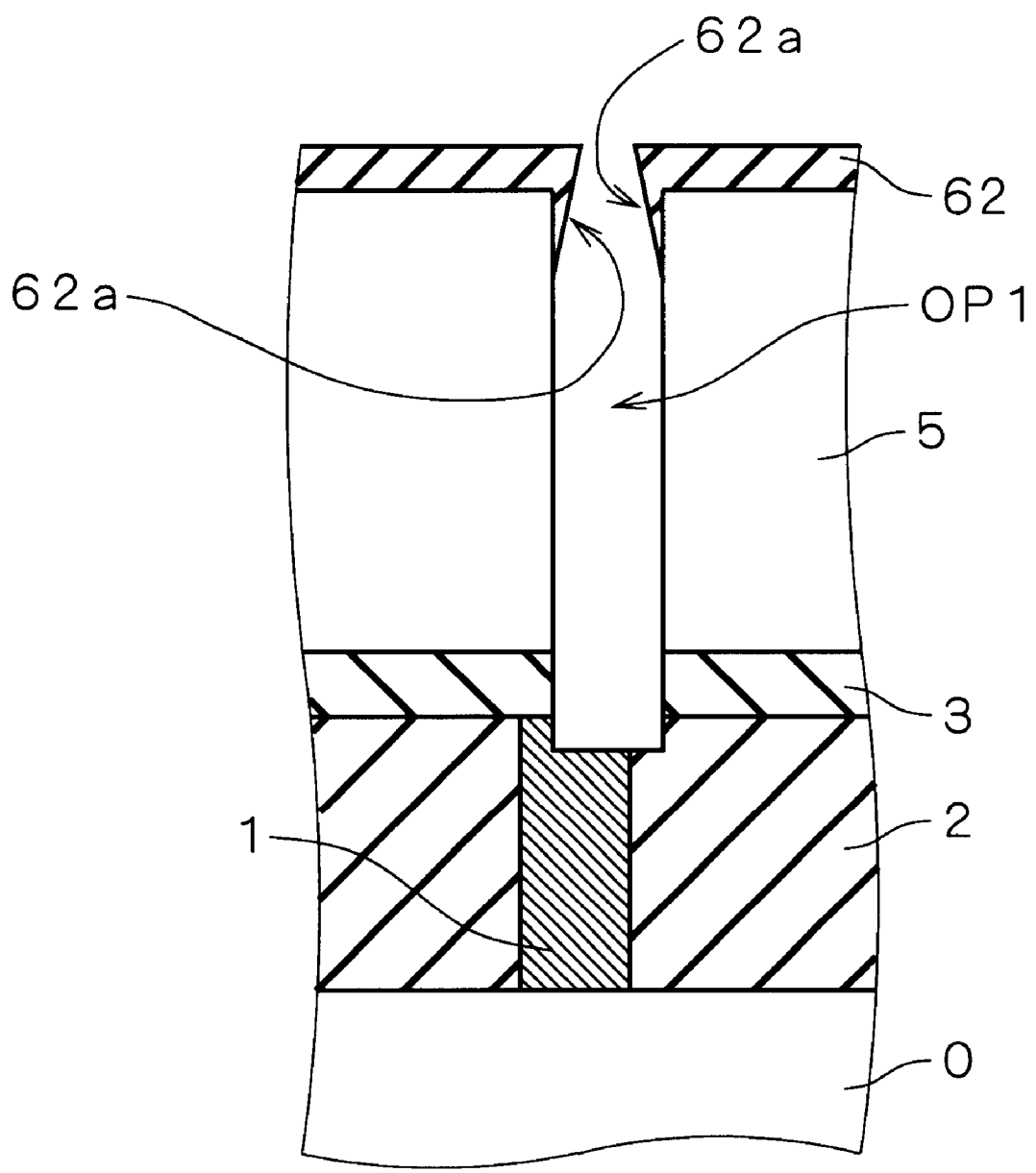
FIG. 8 illustrates a method of manufacturing a semiconductor device according to a third preferred embodiment of the present invention.

FIG. 8 illustrates the step of forming an insulating layer in the method according to the third preferred embodiment. In the first preferred embodiment, the insulating layer 6 is provided on the conductive layer 5 by thermal CVD. In contrast, in the third preferred embodiment, after the opening OP1 is defined in the conductive layer 5, the insulating layer is formed by the process having poor step coverage such as plasma CVD.

After the opening OP1 is defined utilizing photolithography and etching, an insulating layer 62 is formed by plasma CVD as illustrated in FIG. 8. For the CVD for growing the insulating layer 62 to a thickness such as 50 nm, silane gas and oxygen gas are used at a temperature of 400° C., for example. Further, the thickness of the conductive layer 5 is 500 nm.

Except for that described above, the third preferred embodiment follows the same steps as those in the method according to the first preferred embodiment. Hence, the description thereof is omitted.

According to the method of the third preferred embodiment, the insulating layer 62 is provided after the opening OP1 is defined in the conductive layer 5. The insulating layer 62 is formed by the process having poor step coverage. Therefore, it is likely that the insulating layer 62 includes a protruding portion 62a therein defined in the opening OP1 and its vicinity. Therefore, when the opening OP1 is filled with the conductive material 4a, a shoulder portion of the conductive material 4a is likely to be tapered. As a result, when the conductive material 4a serves as a capacitor lower electrode, electric field concentration may be suppressed.

The third preferred embodiment utilizes plasma CVD as an example of the process having poor step coverage. Alternatively, atmospheric CVD and sputtering may be utilized. These processes also give good possibility of generation of the protruding portion 62a of the insulating layer 62 defined in the opening OP1 and its vicinity.

<Fourth Preferred Embodiment>

Contrary to the first through third preferred embodiments utilizing electroplating, the method according to the fourth preferred embodiment of the present invention utilizes selective CVD for forming a capacitor lower electrode.

Figure 9:
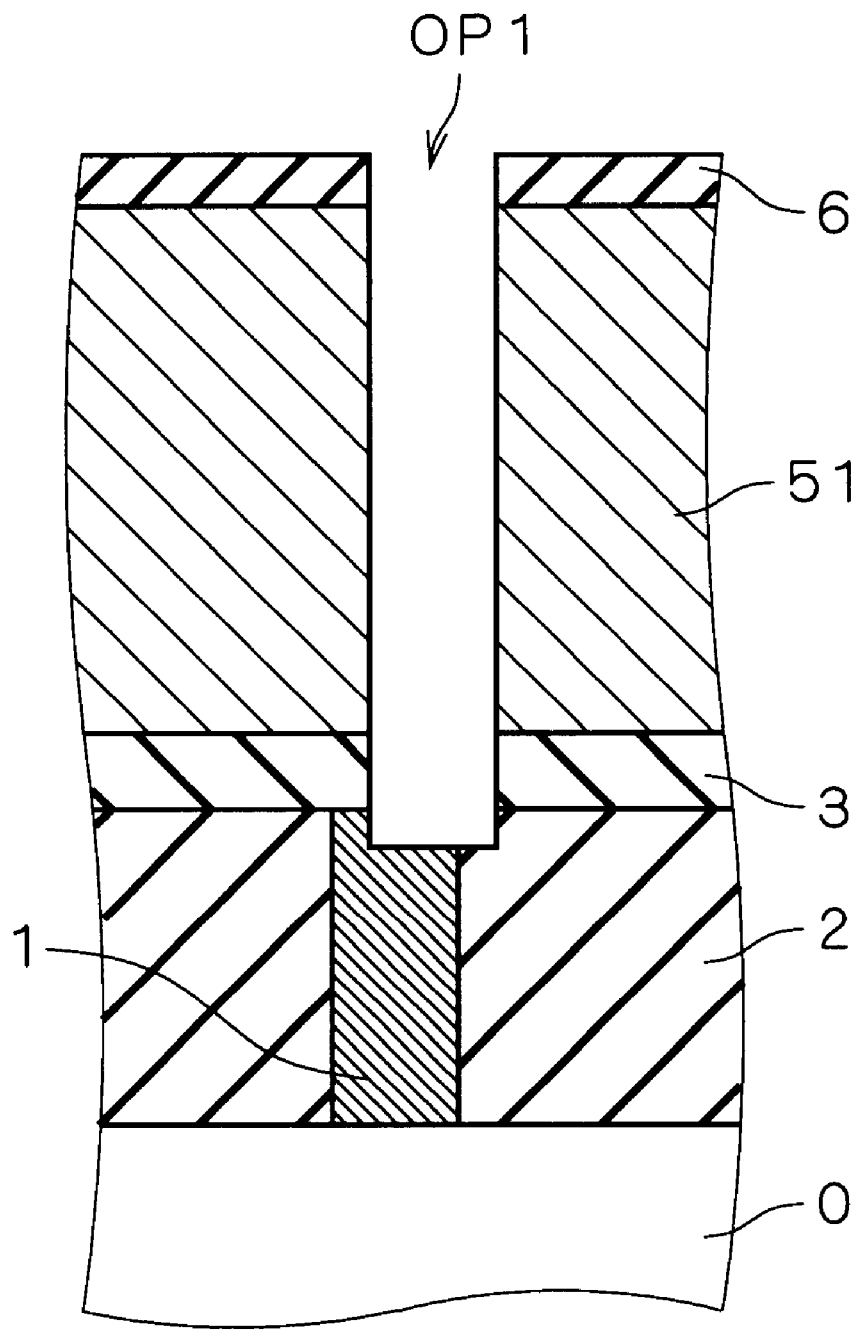
FIGS. 9 through 11 illustrate a method of manufacturing a semiconductor device according to a fourth preferred embodiment of the present invention.
Figure 10:
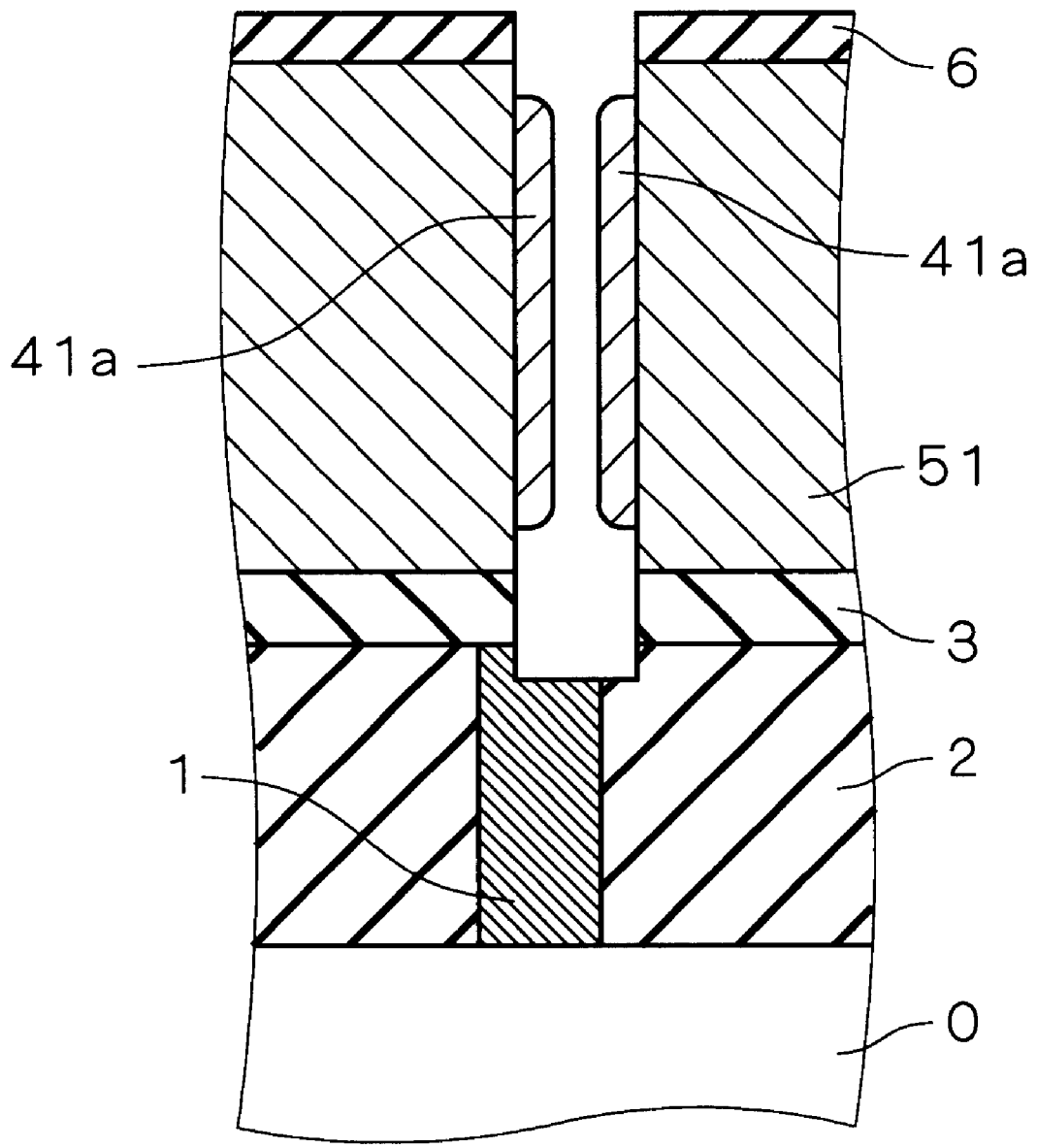
Figure 11:
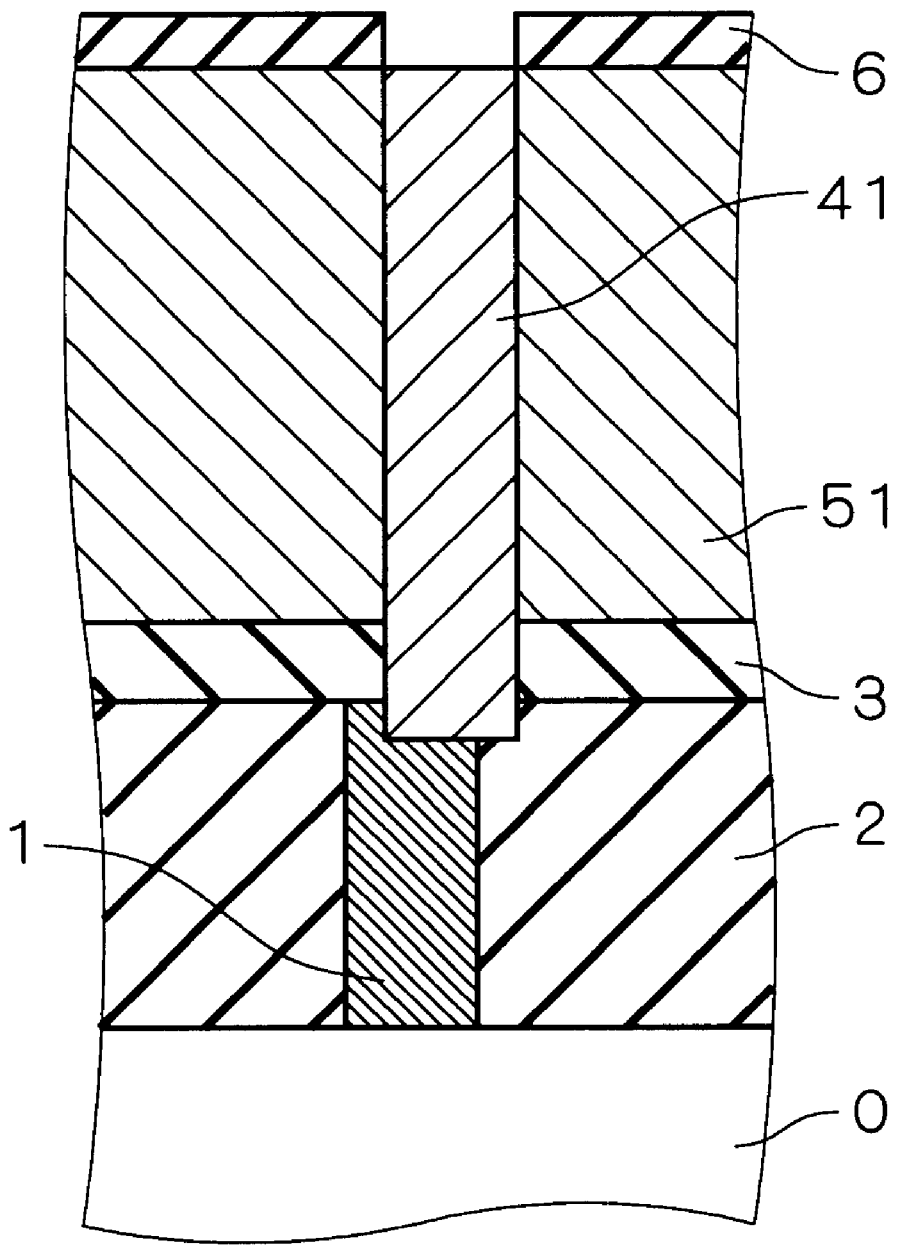
Figure 13:
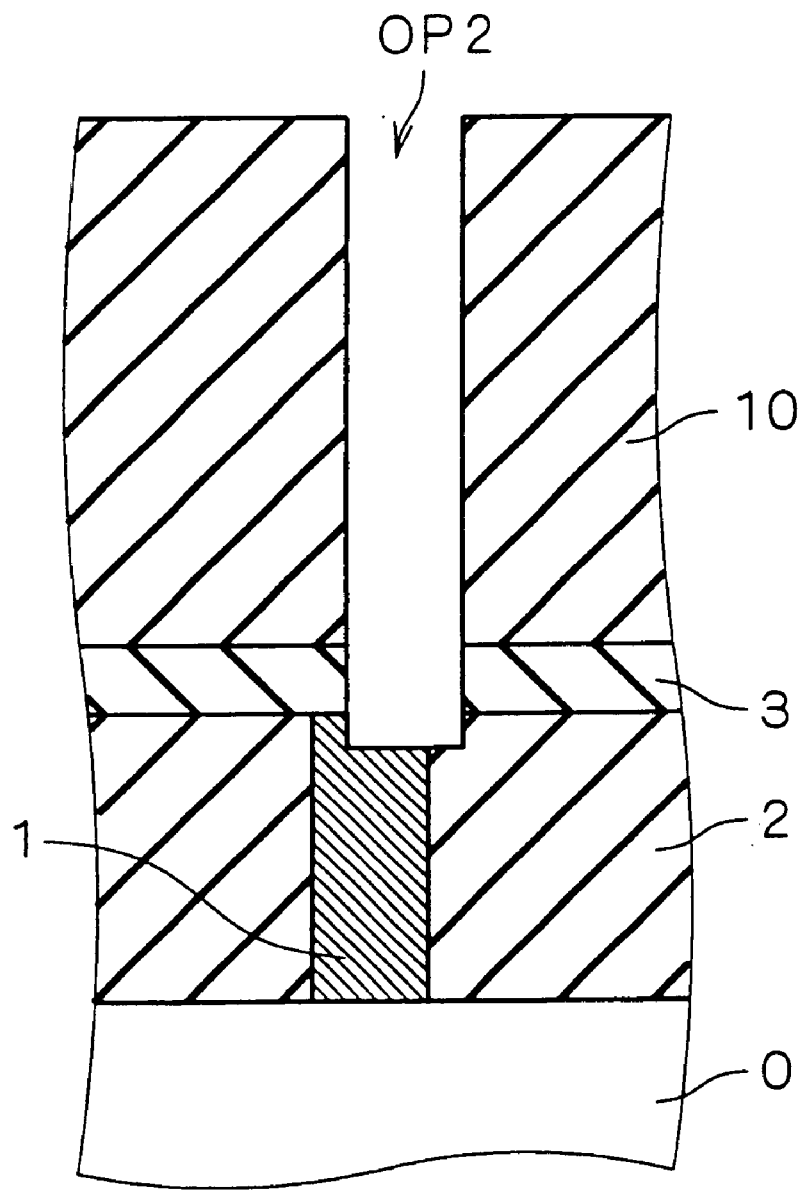
FIGS. 13 and 14 each illustrate in part the steps of a method of manufacturing a semiconductor device in the background art.
Figure 14:
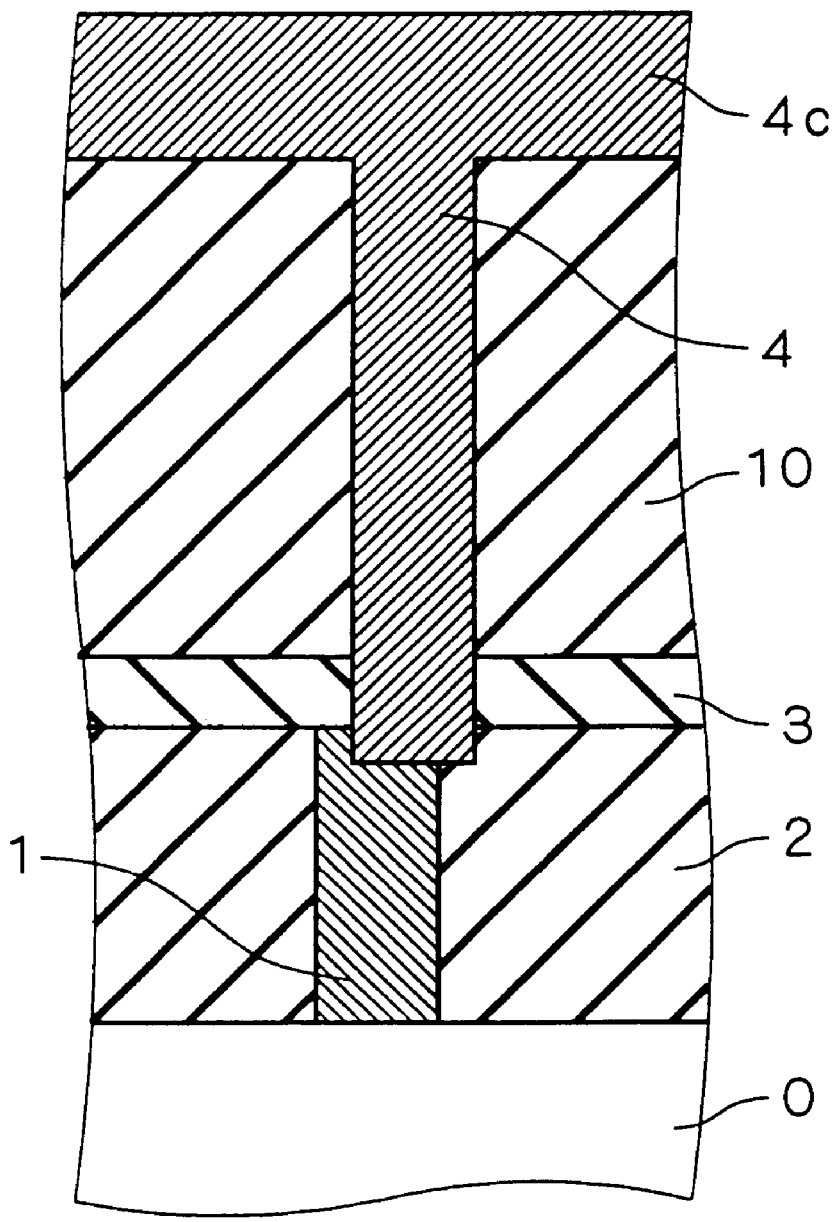

FIGS. 9 through 11 illustrate the method of manufacturing a semiconductor device according to the fourth preferred embodiment. Instead of the conductive layer 5 and the insulating layer 6 provided in the first through third preferred embodiments, the fourth preferred embodiment provides a first layer 51 and a second layer 6 stacked in this order. The first and second layers 51 and 6 each serve as a mold. The opening OP1 is defined to penetrate both the first and second layers 51 and 6 (FIG. 9). The first layer 51 includes titanium nitride and the second layer 6 includes silicon oxide.

The first layer 51 including titanium nitride is formed by reactive sputtering. The thickness of the first layer 51 is set to be 500 nm. The second layer 6 including silicon oxide is formed by plasma CVD using silane gas and oxygen gas at a temperature of 400° C. The thickness of the second layer 6 is set to be 50 nm.

Next, a conductive material 41a including ruthenium is deposited in the opening OP1 by CVD. The conductive material 41a serves as a capacitor lower electrode. According to CVD, ruthenium has the property of being deposited well selectively on titanium nitride. On the other hand, it cannot be selectively deposited well on silicon oxide. That is, with respect to CVD, the conductive material 41a is characteristically deposited more selectively on the first layer 51 than the second layer 6. In view of this, deposition of the conductive material 41a starts from a side surface of the first layer 51 exposed to the opening OP1 (FIG. 10). Further, the first layer 51 holds the second layer 6 provided thereon. Therefore, it is possible to avoid the conductive material 41a from being deposited over the first layer 51. Then, the opening OP1 is filled with the conductive material 41a, thus forming a lower electrode 41 as illustrated in FIG. 11. The first layer 51 and the second layer 6 are thereafter removed.

The conductive material 41a including ruthenium is deposited by thermal CVD using ruthenium octane-dionate and oxygen gases at a temperature of 310° C. In fact, ruthenium is deposited to form a thin film on the second layer 6 including silicon oxide. However, the first and second layers 51 and 6 are removed after formation of the lower electrode 41. In view of this, etching process using oxygen gas is initially performed in the step of removing the first and second layers 51 and 6, thus removing the ruthenium film formed on the second layer 6.

Thereafter the dielectric film 7 and the upper electrode 8 are provided for forming the capacitor, and the third interlayer insulating film 9 is also provided thereon, thus completing the structure illustrated in FIG. 12.

According to the method of the fourth preferred embodiment, the conductive material 41a selectively deposited more on the first layer 51 than the second layer 6 with respect to CVD is formed in the opening OP1 by CVD. Therefore, the conductive material 41a can be formed with reliability in the opening OP1.

Further, the second layer 6 on which the conductive material 41a is characteristically deposited less than on the first layer 51 with respect to CVD is provided on the first layer 51. Therefore, it is allowed to avoid the conductive material 41a from being deposited over the first layer 51. As a result, according to the method of the fourth preferred embodiment, the steps of forming a redundant film and removing the same can be omitted.

Still further, the first layer 51 includes titanium nitride, the second layer 6 includes silicon oxide, and the conductive material 41a includes ruthenium. Therefore, both the first and second layers 51 and 6 are easily formed by the process such as CVD, and are easily removed by dry etching, for example.

Yet further, according to the fourth preferred embodiment, the constituting elements to be arranged under the first layer 51 can be formed at a low temperature of 400° C. or its vicinity.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) providing an element in a main surface of a semiconductor substrate;
   (b) providing a conductive layer, said conductive layer being arranged above said main surface of said semiconductor substrate through an interlayer insulating film;
   (c) providing an insulating layer on said conductive layer;
   (d) defining an opening, said opening penetrating said insulating layer and said conductive layer; and
   (e) bringing said conductive layer to a conducting state for providing a conductive material in said opening, said conductive material being electrically connected to said element.

2. The method according to claim 1, wherein
said conductive layer includes silicon, and
said insulating layer includes silicon oxide.

3. The method according to claim 2, wherein
said conductive layer including silicon is thermally oxidized, thus providing said insulating layer including silicon oxide.

4. The method according to claim 1, wherein
said insulating layer is provided after said opening is defined in said conductive layer.

5. The method according to claim 4, wherein
said insulating layer is provided by plasma CVD.

6. The method according to claim 4, wherein
said insulating layer is provided by atmospheric CVD.

7. The method according to claim 4, wherein
said insulating layer is provided by sputtering.

8. The method according to claim 1, wherein
said conductive material serves as an electrode of a capacitor.

9. A method of manufacturing a semiconductor device, comprising the steps of:
   (a) providing an element in a main surface of a semiconductor substrate;
   (b) providing a first layer, said first layer being arranged above said main surface of said semiconductor substrate through an interlayer insulating film;
   (c) providing a second layer on a surface of said first layer;
   (d) defining an opening, said opening penetrating said first and second layers; and
   (e) selectively providing a conductive material in said opening by CVD, said conductive material being electrically connected to said element, wherein
   with respect to CVD, said conductive material is selectively deposited more on said first layer than said second layer.

10. The method according to claim 9, wherein
said first layer includes titanium nitride,
said second layer includes silicon oxide, and
said conductive material includes ruthenium.

11. The method according to claim 9, wherein
said conductive material serves as an electrode of a capacitor.

* * * * *

UNITED STATES PATENT AND TRADEMARK OFFICE
CERTIFICATE OF CORRECTION

PATENT NO. : 6,670,232 B2
DATED : December 30, 2003
INVENTOR(S) : Tsunemine

It is certified that error appears in the above-identified patent and that said Letters Patent is hereby corrected as shown below:

<u>Title page, Item [54] and Column 1, lines 1 and 2,</u>
Title, should read:
-- METHOD OF PROVIDING A CONDUCTIVE MATERIAL IN AN OPENING --

Signed and Sealed this

Twenty-seventh Day of April, 2004

JON W. DUDAS
*Acting Director of the United States Patent and Trademark Office*